United States Patent
Usami et al.

(10) Patent No.: US 12,451,822 B2
(45) Date of Patent: Oct. 21, 2025

(54) FEEDER MEMBER AND WAFER PLACEMENT TABLE

(71) Applicant: NGK INSULATORS, LTD., Nagoya (JP)

(72) Inventors: Taro Usami, Kasamatsu-Town (JP); Seiya Inoue, Handa (JP); Tatsuya Kuno, Nagoya (JP); Tomoyuki Minami, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 57 days.

(21) Appl. No.: 18/513,850

(22) Filed: Nov. 20, 2023

(65) Prior Publication Data

US 2024/0364241 A1 Oct. 31, 2024

Related U.S. Application Data

(63) Continuation of application No. PCT/JP2023/016640, filed on Apr. 27, 2023.

(51) Int. Cl.
*H01T 23/00* (2006.01)
*H01R 4/02* (2006.01)
*H02N 13/00* (2006.01)
*H01L 21/683* (2006.01)

(52) U.S. Cl.
CPC ............ *H02N 13/00* (2013.01); *H01R 4/027* (2013.01); *H01L 21/6833* (2013.01)

(58) Field of Classification Search
None
See application file for complete search history.

(56) References Cited

U.S. PATENT DOCUMENTS

| | | | | |
|---|---|---|---|---|
| 5,625,526 A | * | 4/1997 | Watanabe | G03F 7/70708 361/234 |
| 6,151,203 A | | 11/2000 | Shamouilian et al. | |
| 7,576,967 B2 | * | 8/2009 | Morioka | H01L 21/6831 361/230 |

(Continued)

FOREIGN PATENT DOCUMENTS

| | | |
|---|---|---|
| JP | 2000-188321 A | 7/2000 |
| JP | 2003-151725 A | 5/2003 |

(Continued)

OTHER PUBLICATIONS

International Search Report and Written Opinion (Application No. PCT/JP2023/016640) dated Jul. 18, 2023 (7 pages).

(Continued)

*Primary Examiner* — Stephen W Jackson
(74) *Attorney, Agent, or Firm* — BURR PATENT LAW, PLLC

(57) ABSTRACT

A feeder member is used to supply electricity to an electrode embedded in a ceramic base. The feeder member includes an electrode-side terminal that is made of a high-melting-point metal containing material and joined to the electrode, an intermediate member that is made of a Cu containing material and directly joined to the electrode-side terminal without using a brazing material, a cable support member that is made of a Cu containing material and joined to the intermediate member, and a cable that is made of a Cu containing material and that has one end whose end surface is welded to the cable support member.

6 Claims, 6 Drawing Sheets

(56) References Cited

U.S. PATENT DOCUMENTS

| | | | |
|---|---|---|---|
| 11,610,798 B2* | 3/2023 | Kuno | ............... H01J 37/32642 |
| 2017/0278732 A1 | 9/2017 | Amano | |
| 2020/0411357 A1 | 12/2020 | Kunita | |

FOREIGN PATENT DOCUMENTS

| | | |
|---|---|---|
| JP | 3602582 B2 | 12/2004 |
| JP | 2005-018992 A | 1/2005 |
| JP | 2007-035886 A | 2/2007 |
| JP | 2013-191626 A | 9/2013 |
| JP | 2016-062999 A | 4/2016 |
| JP | 2017-183329 A | 10/2017 |
| JP | 2022-061618 A | 4/2022 |
| JP | 2022-124887 A | 8/2022 |
| KR | 10-2013-0059763 A | 6/2013 |
| WO | 2019/181525 A1 | 9/2019 |

OTHER PUBLICATIONS

Korean Office Action (with English translation) dated Jan. 13, 2025 (Application No. 10-2023-7039882).
Korean Office Action (with English translation), Korean Application No. 10-2023-7039882, dated Sep. 11, 2025 (14 pages).

* cited by examiner

FEEDER MEMBER AND WAFER PLACEMENT TABLE

BACKGROUND OF THE INVENTION

1. Field of the Invention

The present invention relates to a feeder member and a wafer placement table.

2. Description of the Related Art

A wafer placement table is used to attract a wafer and heat/cool the wafer in, for example, an etching device, an ion implantation device, or an electron-beam exposure device. As such a wafer placement table, an apparatus including a ceramic electrostatic chuck that has a wafer placement surface and that has built therein an electrostatic electrode and a heater electrode, and including a metal base member that is bonded to a surface of the electrostatic chuck on a side opposite to the wafer placement surface is known. Patent Literature 1 discloses a feeder member that is used to supply electricity to electrodes (an electrostatic electrode and a heater electrode) embedded in an electrostatic chuck of such a wafer placement table. The feeder member includes an electrode-side terminal that is joined to the electrodes, a flexible cable whose upper end is connected to the electrode-side terminal, and a female connector that is connected to a lower end of the cable. A male connector of an external device is connected to the female connector. According to the feeder member, even if a force that pushes toward the electrodes acts upon the female connector, the cable is flexed and absorbs the force, as a result of which the electrostatic chuck can be prevented from being damaged.

CITATION LIST

Patent Literature

PTL 1: Japanese Unexamined Patent Application Publication No. 2013-191626

SUMMARY OF THE INVENTION

When forming the feeder member described above, a cable insertion hole may be provided in the electrode-side terminal made of Mo, and the upper end of the cable made of Cu may be inserted into the hole to join them by electrode-beam welding or laser-beam welding. However, in such a welding method, since the temperature does not rise to a temperature close to the melting point of Mo, an alloy of Mo and Cu is not easily formed, and the melted Cu of the cable may only be in contact with an inner surface of the hole of the electrode-side terminal without being joined thereto. In addition, when solidifying the melted Cu, a pore may be formed at an interface between Cu and Mo. Therefore, a sufficient joining strength between the electrode-side terminal made of Mo and the cable made of Cu may not be obtained, and an electrical conduction failure may occur between the electrode-side terminal and the cable.

The present invention has been made to solve such problems, and a primary object of the present invention is to provide a feeder member that has sufficient strength and in which an electrical conduction failure is less likely to occur.

[1] A feeder member of the present invention is a feeder member that is used to supply electricity to an electrode embedded in a ceramic base. The feeder member includes an electrode-side terminal that is made of a high-melting-point metal containing material and that is joined to the electrode, an intermediate member that is made of a Cu containing material and directly joined to the electrode-side terminal without using a brazing material, a cable support member that is made of a Cu containing material and joined to the intermediate member, and a cable that is made of a Cu containing material and that has one end whose end surface is welded to the cable support member.

In the feeder member, the intermediate member made of a Cu containing material is directly joined to the electrode-side terminal made of a high-melting-point metal containing material without using a brazing material. Thus, the electrode-side terminal and the intermediate member are joined to each other with sufficient strength. In addition, the cable support member made of a Cu containing material is joined to the intermediate member made of a Cu containing material. Since these joinings are joinings between members made of a Cu containing material, sufficient strength can be obtained. Furthermore, the end surface of the one end of the cable made of a Cu containing material is welded to the cable support member made of a Cu containing material. Thus, compared with the case where a side surface of the cable is welded to the cable support member, the probability that a gap will be formed in a welded portion of the cable can be reduced, and an electrical conduction failure is less likely to occur. Therefore, the feeder member has sufficient strength, and an electrical conduction failure is less likely to occur.

As an example of a method of manufacturing such a feeder member, a manufacturing method can be employed that includes a step of directly joining the electrode-side terminal and the intermediate member to each other, a step of welding and integrating the cable support member and the end surface of the end of the cable together by radiating a beam (a laser beam, an electron beam, or the like) from the rear surface of a surface of the cable support member, the surface being in contact with the end surface of the end of the cable, while the end surface of the end of the cable is in contact with the cable support member, and a step of joining the cable support member, which has been integrated with the cable, to the intermediate member, which has been directly joined to the electrode-side terminal.

[2] In the feeder member of the present invention (the feeder member described in [1]), the intermediate member and the feeder member may be soldered together. In this case, rework is easier compared with the case where the intermediate member and the cable support member are welded to each other.

[3] In the feeder member of the present invention (the feeder member described in [1] or [2]), the cable support member may be a bottomed cylindrical member having a hole portion formed on a side opposite to the intermediate member, and the cable may have one end whose end surface is joined to a bottom surface of the hole portion of the cable support member.

[4] In the feeder member of the present invention (the feeder member described in any one of [1] to [3]), the electrode-side terminal may be made of a Mo containing material. In this case, when the ceramic base is made of an alumina containing material, generation of cracks or the like between the electrode-side terminal and the ceramic base can be prevented. This is because, since the coefficient of thermal expansion of alumina and the coefficient of thermal expansion of Mo are close to each other, stress that is produced by a difference in thermal expansion is reduced.

[5] A wafer placement table of the present invention includes a ceramic base that includes, at a surface thereof, a wafer placement portion, an electrode embedded in the ceramic base, and a feeder member that is inserted into a surface of the ceramic base on a side opposite to the wafer placement portion and joined to the electrode. The feeder member is the feeder member of the present invention described above (the feeder member described in any one of [1] to [4]), and the electrode-side terminal is joined to the electrode.

In this wafer placement table, the intermediate member made of a Cu containing material is directly joined to the electrode-side terminal made of a high-melting-point metal containing material without using a brazing material. Thus, the electrode-side terminal and the intermediate member are joined to each other with sufficient strength. In addition, the cable support member made of a Cu containing material is joined to the intermediate member made of a Cu containing material. Since these joinings are joinings between members made of a Cu containing material, sufficient strength can be obtained. Furthermore, an end surface of one end of the cable made of a Cu containing material is welded to the cable support member made of a Cu containing material. Thus, compared with the case where a side surface of the cable is welded to the cable support member, the probability that a gap will be formed in a welded portion of the cable can be reduced, and an electrical conduction failure is less likely to occur. Therefore, the feeder member has sufficient strength, and an electrical conduction failure is less likely to occur.

[6] In the wafer placement table of the present invention (the wafer placement table described in [5]), the ceramic base may be made of an alumina containing material, and the electrode-side terminal may be made of a Mo containing material. In this case, generation of cracks or the like between the electrode-side terminal and the ceramic base can be prevented. This is because, since the coefficient of thermal expansion of alumina and the coefficient of thermal expansion of Mo are close to each other, stress that is produced by a difference in thermal expansion is reduced.

Note that the feeder member of the present invention (the feeder member described in any one of [1] to [4]) may further include a connector that is made of a Cu containing material and electrically connected to a conductive member, which is different from the feeder member, and another end of the cable may be joined to the connector. In this case, the connector may include a socket portion that is electrically connected to the conductive member and a recessed portion that is provided on a side opposite to the socket portion, and the other end of the cable may be joined to the recessed portion of the connector while being inserted into the recessed portion.

DETAILED DESCRIPTION OF THE INVENTION

Figure 1:
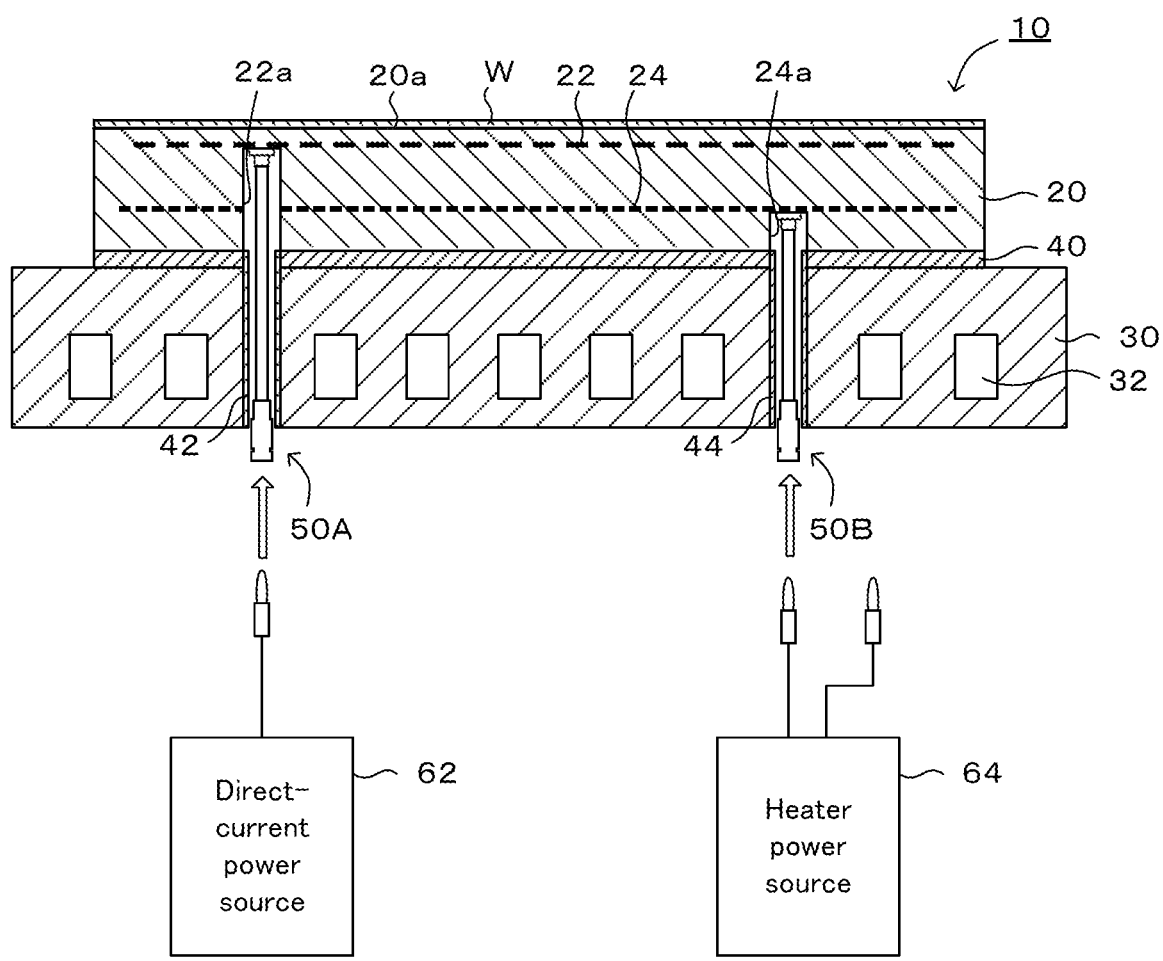
FIG. 1 is a cross-sectional view schematically illustrating a wafer placement table 10.
Figure 2:
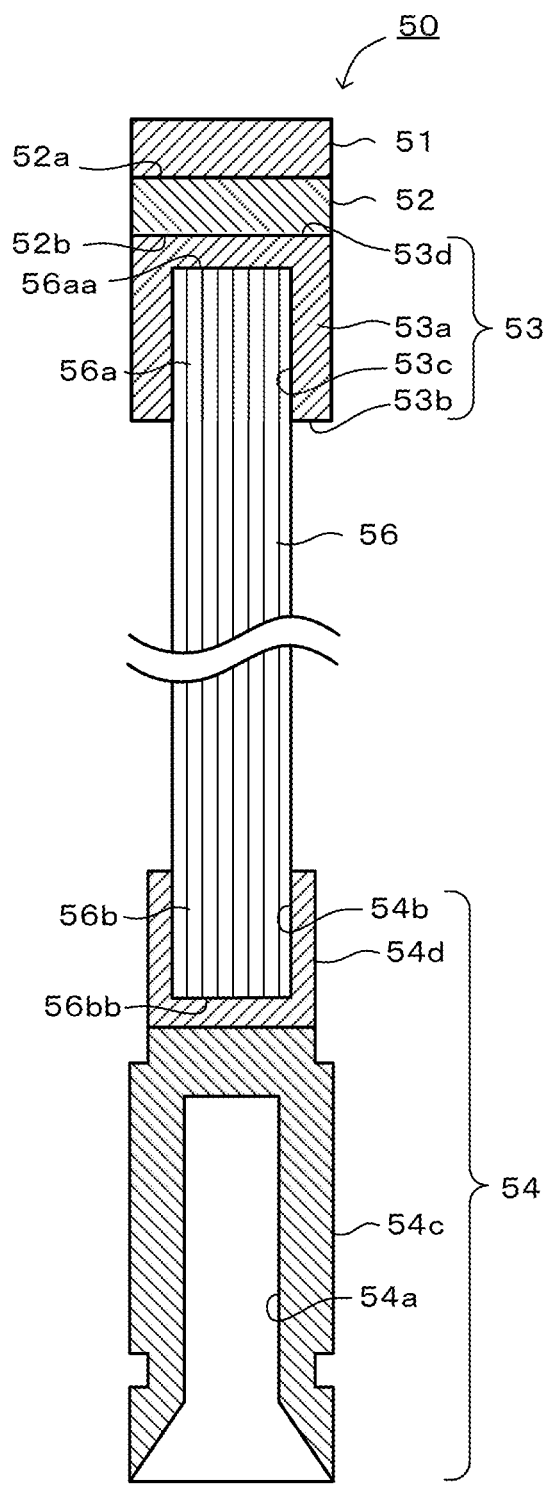
FIG. 2 is a sectional view illustrating a schematic configuration of a feeder member 50.

FIG. 1 is a cross-sectional view showing a schematic structure of a wafer placement table 10 of the present embodiment (cross-sectional view when the wafer placement table 10 is cut by a plane including a central axis of the wafer placement table 10), and FIG. 2 is a cross-sectional view of a schematic structure of a feeder member 50 (cross-sectional view when the feeder member 50 is cut by a plane including a central axis of the feeder member 50). Note that, in the description below, up, down, left, right, front, and back may be used. However, up, down, left, right, front, and back are merely relative positional relationships.

The wafer placement table 10 is used for processing a wafer W. As shown in FIG. 1, the wafer placement table 10 includes a ceramic base 20, an electrostatic electrode 22, a heater electrode 24, a cooling base 30, a joined layer 40, and feeder members 50A and 50B.

The ceramic base 20 is a disc-shaped member having, at its surface, a wafer placement surface 20a. The ceramic base 20 is made of a ceramic containing material. The ceramic containing material is a material whose main component is ceramic, and may contain, in addition to ceramic, for example, a component that is derived from a sintering additive (for example, a rare-earth element), or an unavoidable component. "Main component" means that the proportion is 50 mass % of the entire mass or greater (the same shall apply below). The ceramic is, for example, alumina or aluminum nitride.

The electrostatic electrode 22 and the heater electrode 24 are embedded in the ceramic base 20. The electrostatic electrode 22 is embedded on a side closer than the heater electrode 24 to the wafer placement surface 20a. The electrodes 22 and 24 are made of, for example, a material containing W, Mo, WC, MOC, or the like. The electrostatic electrode 22 is a disc-shaped or mesh single-pole electrostatic electrode. In the ceramic base 20, a layer disposed above the electrostatic electrode 22 functions as a dielectric layer. An electrostatic-attraction direct-current power source 62 is connected to the electrostatic electrode 22 through the feeder member 50A. The heater electrode 24 is wired in a one-stroke pattern from one end to the other end so as to extend over the entire wafer placement surface 20a in plan view. A heater power source 64 is connected to one end of the heater electrode 24 through the feeder member 50B. Similarly to the one end of the heater electrode 24, although not shown, the other end of the heater electrode 24 is also connected to the heater power source 64 through the feeder member 50B.

The cooling base 30 is a disc-shaped member including a refrigerant flow path 32 in which a refrigerant can circulate. The refrigerant flow path 32 is formed in a one-stroke pattern from one end to the other end so as to extend over the entire surface of the ceramic base 20 in plan view. One end and the other end of the refrigerant flow path 32 are connected to a refrigerant circulation pump (not shown) having the function of regulating the temperature of a refrigerant. The cooling base 30 is made of, for example, a conductive material containing a metal. The conductive material is, for example, a composite material or a metal. The composite material is, for example, a metal matrix composite (MMC), and the MMC is, for example, a material containing Si, SiC, and Ti, or a material in which a SiC porous body is impregnated with Al and/or Si. The material containing Si, SiC, and Ti is called SiSiCTi, the material in which the SiC porous body is impregnated with Al is called AlSiC, and the material in which the SiC porous body is impregnated with Si is called SiSiC. The metal is, for example, Al, Ti, Mo, or an alloy thereof.

The joined layer 40 joins a lower surface of the ceramic base 20 and an upper surface of the cooling base 30. The joined layer 40 may be a metal joined layer made of, for example, solder or a metal brazing material. The metal joined layer is formed by, for example, TCB (thermal compression bonding). TCB refers to a publicly known method in which a metal joining material is interposed between two members to be joined and the two members are pressed and joined to each other while being heated to a temperature less than or equal to the solidus temperature of the metal joining material.

The feeder member 50A has its upper end joined to the electrostatic electrode 22 with the feeder member 50A extending via a through hole that extends through the cooling base 30 in an up-down direction and extending via a through hole that extends through the joined layer 40 in the up-down direction, and with the feeder member 50A being inserted in a through hole 22a that extends from the lower surface of the ceramic base 20 to the electrostatic electrode 22. An insulating tube 42 is inserted in the through hole that extends through the cooling base 30 in the up-down direction and in the through hole that extends through the joined layer 40 in the up-down direction. The feeder member 50A passes through the inside of the insulating tube 42.

The feeder member 50B has its upper end joined to the heater electrode 24 with the feeder member 50B extending via a through hole that extends through the cooling base 30 in the up-down direction and extending via a through hole that extends through the joined layer 40 in the up-down direction, and with the feeder member 50B being inserted in a through hole 24a that extends from the lower surface of the ceramic base 20 to the heater electrode 24. An insulating tube 44 is inserted in the through hole that extends through the cooling base 30 in the up-down direction and in the through hole that extends through the joined layer 40 in the up-down direction. The feeder member 50B passes through the inside of the insulating tube 44.

The feeder members 50A and 50B have the same structure except that their cable lengths differ from each other. Therefore, the feeder members 50A and 50B are described below as the feeder member 50 without distinguishing them.

As illustrated in FIG. 2, the feeder member 50 includes an electrode-side terminal 51, an intermediate member 52, a cable support member 53, a connector 54, and a cable 56.

The electrode-side terminal 51 is a disc-shaped member made of a high-melting-point metal containing material. The high-melting-point metal containing material is a material whose main component is a metal having a high melting point, and may contain, in addition to a metal having a high melting point, for example, an unavoidable component or a component that is contained in the ceramic base 20. The metal having a high melting point is, for example, Mo or W. When the ceramic base 20 is made of an alumina containing material, the electrode-side terminal 51 is preferably made of a Mo containing material. The electrode-side terminal 51 is joined to an electrode (the electrostatic electrode 22 or the heater electrode 24) and the ceramic base 20 that is disposed around the electrode with a brazing material. The brazing material is, for example, an Au containing alloy. The Au containing alloy is, for example, an AgGe alloy, an AuSn alloy, or an AuSi alloy. When the electrode-side terminal 51 is made of a Mo containing material, an AuGe alloy is preferably used for the brazing material.

The intermediate member 52 is a member that is made of a Cu containing material and that has a circular plate-like shape. The Cu containing material is a material whose main component is Cu and may contain an unavoidable component or the like in addition to Cu (the same shall apply below). The intermediate member 52 has a terminal joining surface 52a that has a circular shape and that is joined to the electrode-side terminal 51 and a cable-support-member joining surface 52b that has a circular shape and that is opposite to the terminal joining surface 52a. The terminal joining surface 52a is directly joined to the electrode-side terminal 51 without using a brazing material. Thus, the strength of a joined part where the terminal joining surface 52a and the electrode-side terminal 51 are joined to each other is sufficiently increased. When the joined part where the terminal joining surface 52a and the electrode-side terminal 51 are joined to each other is seen in a SEM photograph, it is preferable that no gaps are visible at a joining interface.

The cable support member 53 is a bottomed cylindrical member made of a Cu containing material, that is, a member in the form of a column 53a with a columnar hole 53c formed in one surface thereof 53b. A rear surface 53d of the bottom surface of the columnar hole 53c is a circular surface and is joined to the cable-support-member joining surface 52b of the intermediate member 52. This joining may be performed by soldering or may be performed by welding (electron-beam welding, laser-beam welding, or the like). Using soldering for the joining offers the advantage of easy and cost-effective reworking.

The connector 54 is made of a Cu containing material and includes a socket portion 54a and a recessed portion 54b. The socket portion 54a is provided on a lower side of the connector 54 and is electrically connected to a conductive member of an external device (e.g., the direct-current power source 62 or the heater power source 64). In the present embodiment, the socket portion 54a is a banana jack, and the conductive member of the external device is a banana plug that is inserted into the banana jack. The recessed portion 54b is a hole provided on an upper side of the connector 54. The connector 54 is one in which a lower member 54c including the socket portion 54a and an upper member 54d including the recessed portion 54b are joined to each other. The lower member 54c and the upper member 54d can be joined to each other by soldering or welding (electron-beam welding, laser-beam welding, or the like). The lower member 54c and the upper member 54d are both made of a Cu containing material, and thus, the strength of a welded portion where these members 54c and 54d are welded to each other is sufficiently increased.

The cable 56 is a flexible cable made of a Cu containing material. In the present embodiment, the cable 56 is a stranded wire of thin metal wires made of a Cu containing material. One end 56a of the cable 56 has an end surface 56aa, and the end surface 56aa of the one end 56a is welded to the bottom surface of the columnar hole 53c of the cable support member 53 in a state where the one end 56a is inserted into the columnar hole 53c of the cable support member 53. The joining of the end surface 56aa and the bottom surface can be performed by, for example, electron-beam welding or laser-beam welding. Since the cable 56 and the cable support member 53 are both made of a Cu containing material, the strength of the welded portion is sufficiently increased. Another end 56b of the cable 56 has an end surface 56bb, and the end surface 56bb is welded to the bottom surface of the recessed portion 54b of the connector 54 in a state where the other end 56b is inserted into the recessed portion 54b. The joining of the end surface 56bb and the bottom surface can be performed by, for example, electron-beam welding or laser-beam welding.

Next, an example of manufacturing the feeder member 50 (including an example of attaching the feeder member 50 to an electrode) will be described with reference to FIGS. 3A to 3E. FIGS. 3A to 3E include diagrams illustrating a process of manufacturing the feeder member 50. Here, the electrode-side terminal 51 is made of a Mo containing material, and the intermediate member 52, the cable support member 53, the connector 54 (the lower member 54c and the upper member 54d), and the cable 56 are made of a Cu containing material.

Figure 3:
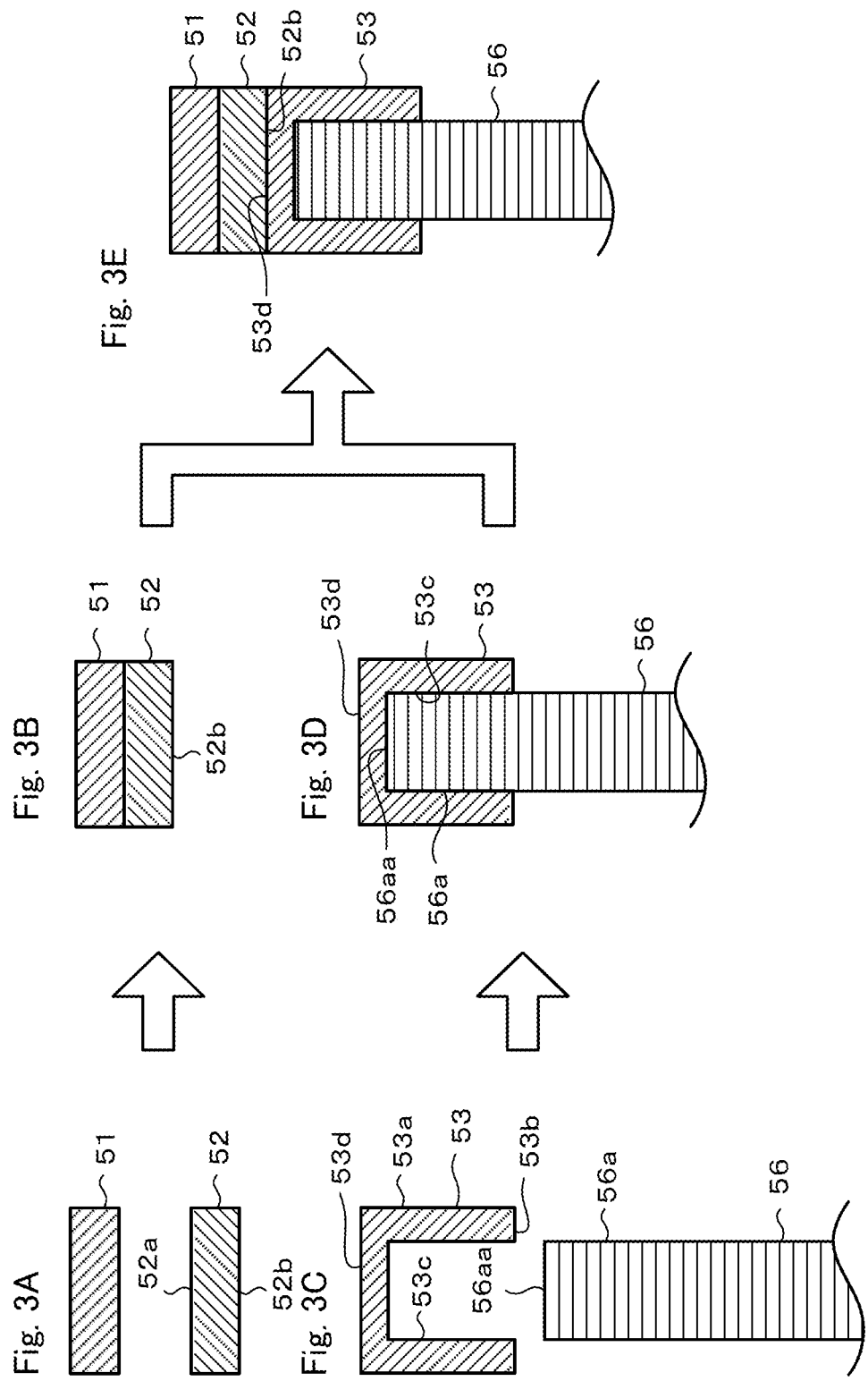
FIGS. 3A to 3E include diagrams illustrating a process of manufacturing the feeder member 50.

First, the electrode-side terminal 51 and the intermediate member 52 are prepared (see FIG. 3A), and one surface of the electrode-side terminal 51 and the terminal joining surface 52a of the intermediate member 52 are directly joined to each other (see FIG. 3B). They can be directly joined to each other by, for example, a direct joining method disclosed in Japanese Patent No. 3602582 (the same shall apply below).

Next, the cable support member 53 and the cable 56 are prepared, and the one end 56a of the cable 56 is inserted into the columnar hole 53c formed in the cable support member 53 (see FIG. 3C). Subsequently, in a state where the end surface 56aa of the one end 56a of the cable 56 and the bottom surface of the columnar hole 53c are in contact with each other, the end surface 56aa of the cable 56 and the bottom surface of the columnar hole 53c are welded to each other by radiating an electron beam from the rear surface 53d of the bottom surface of the columnar hole 53c (see FIG. 3D). In this case, the welding is performed while the cable 56 is pressed against the bottom surface of the columnar hole 53c. By performing the welding in this manner, the cable 56 is pushed in while the end of the cable 56 is melted, and thus, a sufficient amount of the melted Cu containing material is obtained. Thus, the probability that a very small gap will be formed between the end surface 56aa of the cable 56 and the bottom surface of the columnar hole 53c can be reduced. Note that a laser beam may be used instead of the electron beam.

Next, the rear surface 53d of the cable support member 53, which has been integrated with the cable 56, is joined to the cable-support-member joining surface 52b of the intermediate member 52 which has been directly joined to the electrode-side terminal 51 (see FIG. 3E). The joining may be performed by soldering or may be performed by welding (electron-beam welding, laser-beam welding, or the like). Using soldering for the joining offers the advantage of easy and cost-effective reworking.

Next, although not illustrated in FIGS. 3A to 3E, the upper member 54d is prepared, and the other end 56b of the cable 56 is inserted into the recessed portion 54b of the upper member 54d. Subsequently, in a state where the end surface 56bb of the other end 56b of the cable 56 and the bottom surface of the recessed portion 54b are in contact with each other, the end surface 56bb of the cable 56 and the bottom surface of the recessed portion 54b are welded to each other by radiating an electron beam from the rear surface of the bottom surface of the recessed portion 54b. After that, the upper member 54d and the lower member 54c are joined to each other by soldering or welding (electron-beam welding, laser-beam welding, or the like). As a result, the feeder member 50 illustrated in FIG. 2 is obtained.

Next, the electrode-side terminal 51 of the obtained feeder member 50 is joined to the electrode (the electrostatic electrode 22 or the heater electrode 24) that is embedded in the ceramic base 20 and to a portion of the ceramic base 20 around the electrode. This joining can be performed by using a Au containing alloy (e.g., a AuGe alloy). In this case, the electrode-side terminal 51 is joined to the electrode and to the portion of the ceramic base 20 around the electrode with a brazing joining layer interposed therebetween.

In FIG. 3D, instead of welding the end surface 56aa of the cable 56 and the bottom surface of the columnar hole 53c to each other, welding a side surface of the cable 56 and the inner peripheral surface of the columnar hole 53c to each other may be considered. In this case, an electron beam is radiated from the outer peripheral surface of the cable support member 53. However, welding cannot be performed while pressing the side surface of the cable 56 against the inner peripheral surface of the columnar hole 53c, and thus, a very small gap is likely to be formed between the side surface of the cable 56 and the inner peripheral surface of the columnar hole 53c. This may result in insufficient joining strength between the cable 56 and the cable support member 53 or an electrical conduction failure between the cable 56 and the cable support member 53.

In addition, in the case of radiating an electron beam from the outer peripheral surface of the cable support member 53, it is necessary to increase the length of the cable support member 53 in order to ensure an irradiation region. As a result, the length of the cable 56 that is accommodated in the wafer placement table 10 becomes relatively short, making it difficult for the cable 56 to be accommodated in the wafer placement table 10. When the cable 56 becomes relatively short, its flexibility deteriorates, and the moment that acts on the cable support member 53 increases, so that the cable support member 53 may easily break. In the present embodiment, an electron beam is radiated from the rear surface 53d of the cable support member 53, and thus, it is not necessary to increase the length of the cable support member 53, and such an undesirable situation will not occur.

In the feeder member 50, which has been described in detail above, the intermediate member 52 made of a Cu containing material is directly joined to the electrode-side terminal 51 made of a high-melting-point metal containing material without using a brazing material. Thus, the electrode-side terminal 51 and the intermediate member 52 are joined to each other with sufficient strength. In addition, the cable support member 53 made of a Cu containing material is joined to the intermediate member 52 made of a Cu containing material. Since these joinings are joinings between members made of a Cu containing material, sufficient strength can be obtained. Furthermore, the end surface 56aa of the one end 56a of the cable 56 made of a Cu containing material is welded to the cable support member 53 made of a Cu containing material. Thus, compared with the case where the side surface of the cable 56 is welded to the cable support member 53, the probability that a gap will be formed in a welded portion of the cable 56 can be reduced, and an electrical conduction failure is less likely to occur. Therefore, the feeder member 50 has sufficient strength, and an electrical conduction failure is less likely to occur.

It is preferable that the intermediate member 52 and the cable support member 53 be soldered to each other. In this case, the manufacturing cost can be reduced, and rework is easier compared with the case where the intermediate member 52 and the cable support member 53 are welded to each other.

In addition, in the case where the ceramic base 20 is made of an alumina containing material, it is preferable that the electrode-side terminal 51 be made of a Mo containing material. In this case, generation of cracks or the like between the electrode-side terminal 51 and the ceramic base 20 can be prevented. This is because, since the coefficient of thermal expansion of alumina and the coefficient of thermal expansion of Mo are close to each other, stress that is produced by a difference in thermal expansion is reduced.

Note that the present invention is not limited in any way to the embodiment above, and it goes without saying that the present invention can be carried out in various modes as long as the modes pertain to the technical scope of the present invention.

Figure 4:
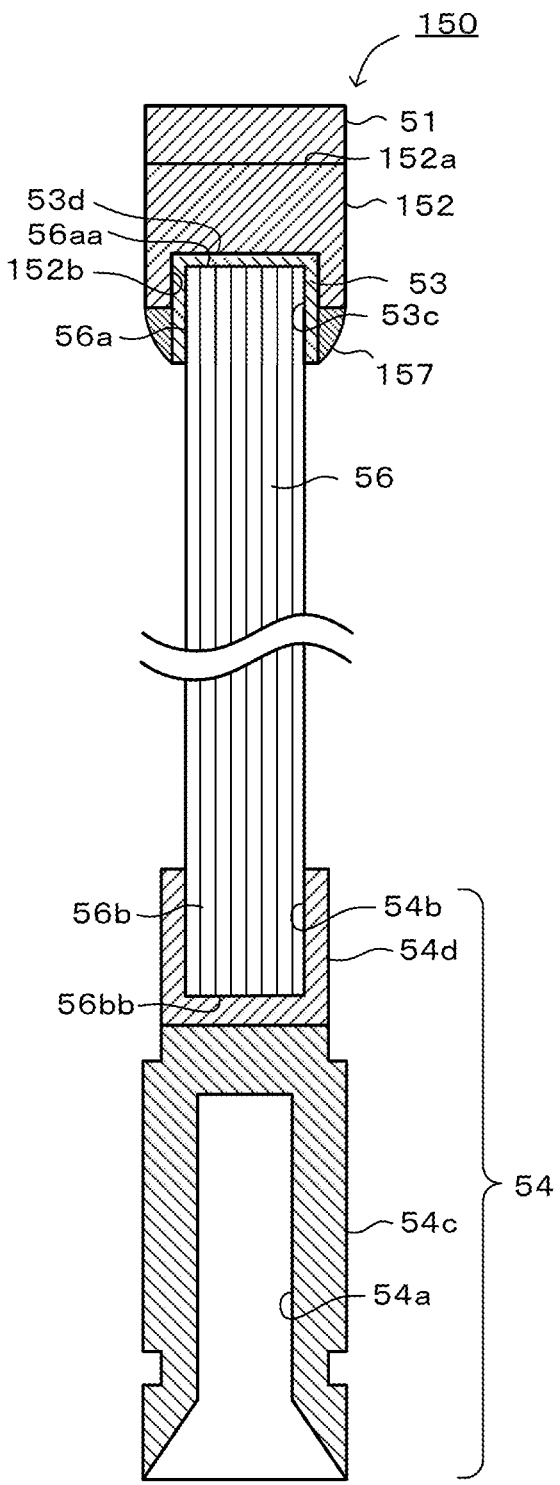
FIG. 4 is a sectional view illustrating a schematic configuration of a feeder member 150.

For example, as the embodiment of the feeder member of the present invention, a feeder member 150 illustrated in FIG. 4 may be employed. The feeder member 150 has a configuration similar to that of the feeder member 50 according to the above-described embodiment except that the feeder member 150 includes an intermediate member 152 instead of the intermediate member 52. Thus, components that are the same as those of the above-described embodiment are denoted by the same reference signs, and descriptions thereof will be omitted. The intermediate member 152 is a columnar member made of a Cu containing material. The intermediate member 152 has a terminal joining surface 152a that is joined to the electrode-side terminal 51 and includes a recessed portion 152b that is formed in a surface opposite to the terminal joining surface 152a. The terminal joining surface 152a is a circular surface and is directly joined to the electrode-side terminal 51 without using a brazing material. Thus, the strength of a joined part where the terminal joining surface 152a and the electrode-side terminal 51 are joined to each other is sufficiently increased. The cable support member 53 has a thickness that is smaller than that in the above-described embodiment. The cable support member 53 is inserted into the recessed portion 152b of the intermediate member 152. A portion of the outer peripheral surface of the cable support member 53 and the upper surface of the cable support member 53 are in contact with the inner peripheral surface and the bottom surface of the recessed portion 152b of the intermediate member 152. In addition, the intermediate member 152 and the cable support member 53 are joined to each other by a joint portion 157. The joint portion 157 is formed by soldering. The intermediate member 152 and the cable support member 53 may be joined to each other by welding (electron-beam welding, laser-beam welding, or the like). The end surface 56aa of the one end 56a is welded to the bottom surface of the columnar hole 53c of the cable support member 53 while the one end 56a of the cable 56 is inserted into the columnar hole 53c of the cable support member 53. For example, before the cable support member 53 and the intermediate member 152 are joined to each other, the one end 56a of the cable 56 is inserted into the columnar hole 53c of the cable support member 53 such that the end surface 56aa is in contact with the bottom surface of the columnar hole 53c, and in this state, an electron beam (or a laser beam) is radiated from the rear surface 53d of the bottom surface of the columnar hole 53c, so that the end surface 56aa is welded to the bottom surface of the columnar hole 53c. Since the cable 56 and the cable support member 53 are both made of a Cu containing material, the strength of the welded portion is sufficiently increased. The feeder member 150 such as that described above can be manufactured in accordance with the example of manufacturing the feeder member 50. In addition, the feeder member 150 can provide advantageous effects similar to those of the feeder member 50.

In the feeder member 150 illustrated in FIG. 4, when the intermediate member 152 and the cable support member 53 are welded to each other, it is preferable that the depth of the recessed portion 152b be 0.1 mm or less. In this case, a gap is less likely to be formed between the inner peripheral surface of the recessed portion 152b and the outer peripheral surface of the cable support member 53.

In the feeder member 150 illustrated in FIG. 4, a thread groove may be formed in the inner peripheral surface of the recessed portion 152b, and a thread may be formed on the outer peripheral surface of the cable support member 53 such that the cable support member 53 is screwed into the recessed portion 152b of the intermediate member 152. In this case, after the cable support member 53 has been screwed into the recessed portion 152b of the intermediate member 152, they are joined to each other by the joint portion 157.

Figure 5:
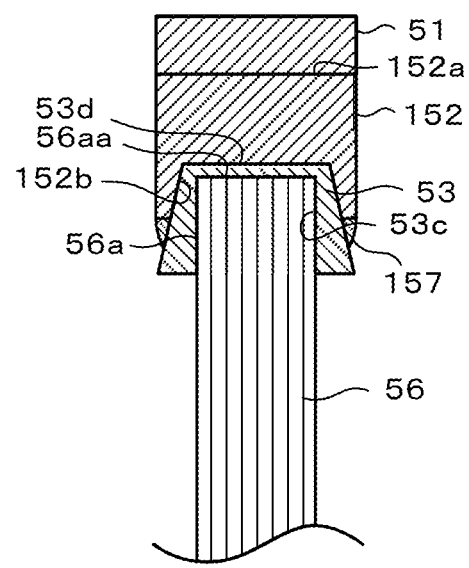
FIG. 5 is a sectional view illustrating a modification of the feeder member 150.

In the feeder member 150 illustrated in FIG. 4, the recessed portion 152b is a columnar hole, and the cable support member 53 is a columnar member. However, their shapes may be changed. For example, as illustrated in FIG. 5, the recessed portion 152b may be a recessed portion having a tapered shape that is tapered from its opening toward its bottom surface, and the outer peripheral surface of the cable support member 53 may be a tapered surface that fits into this recessed portion.

Figure 6:
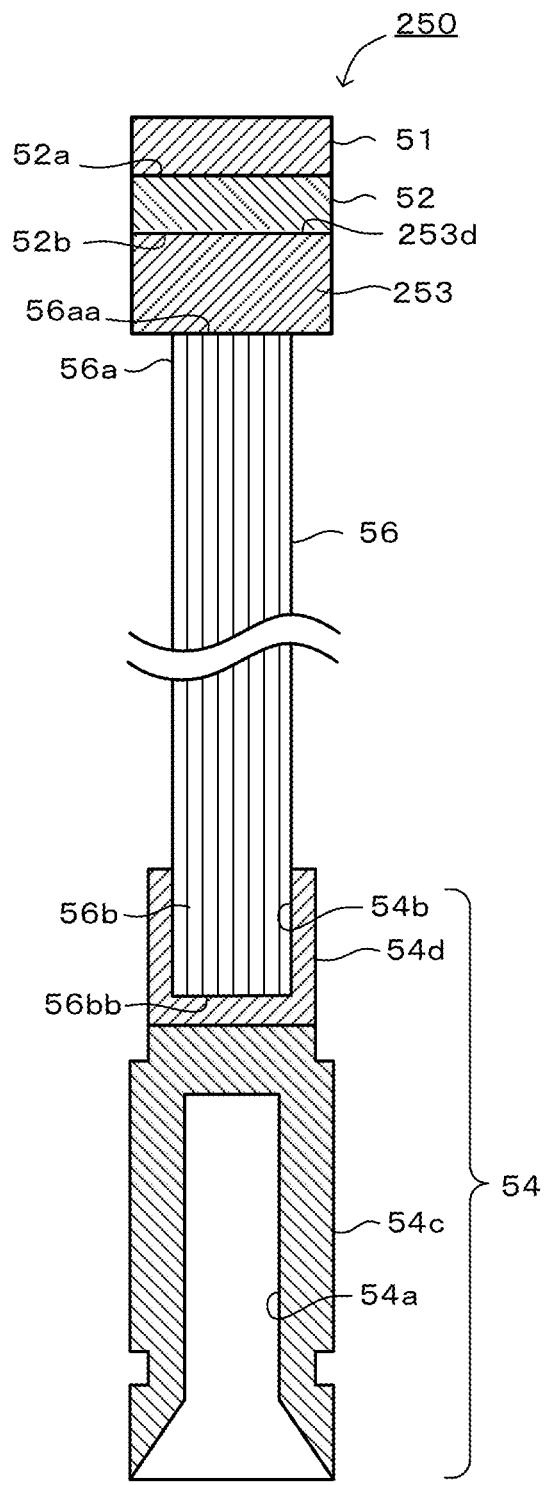
FIG. 6 is a sectional view illustrating a schematic configuration of a feeder member 250.

As the embodiment of the feeder member of the present invention, a feeder member 250 illustrated in FIG. 6 may be employed. The feeder member 250 has a configuration similar to that of the feeder member 50 according to the above-described embodiment except that the feeder member 250 includes a cable support member 253 instead of the cable support member 53. Thus, components that are the same as those of the above-described embodiment are denoted by the same reference signs, and descriptions thereof will be omitted. The cable support member 253 is formed by melting, solidifying, and shaping the end of the cable 56 such that the end has a circular plate-like shape. As a result, the end surface 56aa of the one end 56a of the cable 56 is welded to the cable support member 253. Thus, a gap is less likely to be formed between the end surface 56aa and the cable support member 253. In addition, the joining strength between the cable 56 and the cable support member 253 is sufficiently increased. In addition, the joining strength between the terminal joining surface 52a of the intermediate member 52 and the electrode-side terminal 51 and the joining strength between the cable-support-member joining surface 52b of the intermediate member 52 and the cable support member 253 are also sufficiently increased as in the above-described embodiment. The feeder member 250 such as that described above can be manufactured in accordance with the example of manufacturing the feeder member 50. In addition, the feeder member 250 can provide advantageous effects similar to those of the feeder member 50.

In the embodiment above, although the connector 54 is formed by soldering or welding the lower member 54c and the upper member 54d to each other, the connector 53 may be formed as one-piece instead of being formed by joining a plurality of members in this way. This makes it unnecessary for the manufacturing process of the feeder member 50 to include a step of soldering or welding the lower member 54c and the upper member 54d to each other.

In the embodiment above, the connector 54 of the feeder member 50A may be fixed to the insulating tube 42, or the connector 54 of the feeder member 50B may be fixed to the insulating tube 44.

In the embodiment above, although the electrostatic electrode 22 and the heater electrode 24 are embedded in the ceramic base 20, either one of them may be embedded in the ceramic base 20. In addition, it is possible to embed a plasma-generation electrode in the ceramic base 20 and attach the feeder member 50 to this electrode in the same way as in the embodiment above.

In the embodiment above, although the connector 54 has a socket portion 54*a* that is a banana jack, the connector 53 may have a banana plug instead of the socket portion 54*a*. In this case, the banana plug of the connector 54 is inserted into a banana jack that is a conductive member of an external device (for example, the direct-current power source 62 or the heater power source 64).

In the embodiment above, although the joined layer 40 is a metal joined layer, the joined layer 40 may be a resin adhesive layer.

International Application No. PCT/JP2023/016640, filed on Apr. 27, 2023, is incorporated herein by reference in its entirety.

What is claimed is:

1. A feeder member that is used to supply electricity to an electrode embedded in a ceramic base, the feeder member comprising:
   an electrode-side terminal that is made of a high-melting-point metal containing material and that is joined to the electrode;
   an intermediate member that is made of a Cu containing material and directly joined to the electrode-side terminal without using a brazing material;
   a cable support member that is made of a Cu containing material and joined to the intermediate member; and
   a cable that is made of a Cu containing material and that has one end whose end surface is welded to the cable support member.

2. The feeder member according to claim 1, wherein the intermediate member and the cable support member are soldered together.

3. The feeder member according to claim 1, wherein the cable support member is a bottomed cylindrical member having a hole portion formed on a side opposite to the intermediate member, and
   wherein the cable has one end whose end surface is joined to a bottom surface of the hole portion of the cable support member.

4. The feeder member according to claim 1, wherein the electrode-side terminal is made of a Mo containing material.

5. A wafer placement table comprising:
   a ceramic base that includes, at a surface thereof, a wafer placement portion;
   an electrode embedded in the ceramic base; and
   a feeder member that is inserted into a surface of the ceramic base on a side opposite to the wafer placement portion and joined to the electrode,
   wherein the feeder member is the feeder member according to claim 1, and the electrode-side terminal is joined to the electrode.

6. The wafer placement table according to claim 5, wherein the ceramic base is made of an alumina containing material, and
   wherein the electrode-side terminal is made of a Mo containing material.

* * * * *